(12) United States Patent
Aremallapur et al.

(10) Patent No.: US 10,693,444 B1
(45) Date of Patent: Jun. 23, 2020

(54) MIXED SIGNAL CIRCUIT SPUR CANCELLATION

(71) Applicant: TEXAS INSTRUMENTS INCORPORATED, Dallas, TX (US)

(72) Inventors: Nagalinga Swamy Basayya Aremallapur, Ranebennur (IN); Eeshan Miglani, Chhindwara (IN); Visvesvaraya Pentakota, Bengaluru (IN); Praxal Sunilkumar Shah, Ahmedabad (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/396,873

(22) Filed: Apr. 29, 2019

Related U.S. Application Data

(60) Provisional application No. 62/787,023, filed on Dec. 31, 2018.

(30) Foreign Application Priority Data

Nov. 30, 2018 (IN) .............................. 201841045416

(51) Int. Cl.
*H03K 3/013* (2006.01)
*H03K 3/037* (2006.01)
*H03K 21/10* (2006.01)
(52) U.S. Cl.
CPC ............. *H03K 3/013* (2013.01); *H03K 3/037* (2013.01); *H03K 21/10* (2013.01)

(58) Field of Classification Search
CPC ..................................................... H03K 3/013
See application file for complete search history.

(56) References Cited

U.S. PATENT DOCUMENTS

| | | | | |
|---|---|---|---|---|
| 3,786,276 A | * | 1/1974 | Rosch | G01R 29/0273 326/21 |
| 4,028,560 A | * | 6/1977 | Bainter | H03K 3/013 327/386 |
| 4,426,714 A | * | 1/1984 | Ashida | H04L 7/0276 327/141 |
| 4,786,823 A | * | 11/1988 | Abe | H03K 5/1252 327/34 |
| 4,931,748 A | * | 6/1990 | McDermott | G01R 29/0273 331/1 A |
| 5,151,612 A | * | 9/1992 | Ishikawa | H03K 3/037 327/310 |
| 7,135,895 B2 | * | 11/2006 | Komura | G06F 1/04 327/108 |

(Continued)

*Primary Examiner* — Thomas J. Hiltunen
(74) *Attorney, Agent, or Firm* — John R. Pessetto; Charles A. Brill; Frank D. Cimino

(57) ABSTRACT

A spur cancellation circuit for use in a mixed signal circuit. A spur cancellation circuit includes a clock generation circuit, a flip-flop bank, and a control circuit. The clock generation circuit is configured to generate a clock signal. The flip-flop bank is coupled to the clock generation circuit, and includes a plurality of flip-flops configured to be clocked by the clock signal. The control circuit is coupled to the clock generation circuit and the flip-flop bank. The control circuit is configured to individually enable one or more of the flip-flops to change state responsive to the clock signal and consume a predetermined amount of power; and to provide a data value to be clocked into the flip-flops.

16 Claims, 7 Drawing Sheets

(56) References Cited

U.S. PATENT DOCUMENTS

| | | | |
|---|---|---|---|
| 7,391,241 B2* | 6/2008 | Rajasekhar | H03K 19/00346 326/46 |
| 2010/0090739 A1* | 4/2010 | Huang | G06F 1/10 327/176 |

* cited by examiner

MIXED SIGNAL CIRCUIT SPUR CANCELLATION

RELATED APPLICATIONS

This application claims priority to India Provisional Application No. 201841045416, filed Nov. 30, 2018, titled "Methodology to Mitigate Digital Spurs," and U.S. Provisional Application No. 62/787,023 filed Dec. 31, 2018, titled "Mixed Signal Circuit Spur Cancellation," which are hereby incorporated herein in their entirety.

BACKGROUND

In mixed signal integrated circuits, such as a System on Chip (SOC) circuits, multiple functional circuit blocks are integrated in a single chip. Mixed signal integrated circuits include both digital and analog circuits on the same chip. For example, a single chip may include an analog-to-digital converter, analog signal conditioning circuitry, digital signal processing circuitry, digital signal communication circuitry, etc.

In mixed signal integrated circuits, spurs caused by switching in the digital circuits may be induced in the analog signals present in the circuit. For example, switching transients in digital Metal Oxide Semiconductor (MOS) circuits may be coupled to analog circuits integrated on the same die through ground, power supplies, or the substrate of the integrated circuit. If the spurs due to digital switching lie in the band of interest of an analog circuit, the spur can degrade the performance of the analog circuit.

SUMMARY

A spur cancellation circuit and a mixed signal circuit that includes the spur cancellation circuit are disclosed herein. In one example, a mixed signal circuit includes an analog circuit and a digital circuit. The digital circuit, includes a spur cancellation circuit. The spur cancellation circuit includes a clock generation circuit, a flip-flop bank, and a control circuit. The flip-flop bank is coupled to the clock generation circuit, and includes a plurality of flip-flops. Each of the flip-flops includes a clock input that is coupled to a clock output of the clock generation circuit. The control circuit is coupled to the clock generation circuit and the flip-flop bank. The control circuit includes a plurality of clock enable outputs and a data output. Each of the clock enable outputs is coupled to a clock enable input of one of the flip-flops. The data output is coupled to a data input of one of the flip-flops.

In another example, a spur cancellation circuit includes a clock generation circuit, a flip-flop bank, and a control circuit. The clock generation circuit is configured to generate a clock signal. The flip-flop bank is coupled to the clock generation circuit, and includes a plurality of flip-flops configured to be clocked by the clock signal. The control circuit is coupled to the clock generation circuit and the flip-flop bank. The control circuit is configured to individually enable one or more of the flip-flops to change state responsive to the clock signal and consume a predetermined amount of power; and to provide a data value to be clocked into the flip-flops.

In a further example, a method for cancelling spurs in a mixed signal circuit includes activating clock selection signals to a clock generation circuit, wherein the clock selection signals configure the clock generation circuit to generate a clock signal having a given phase. A clock signal having the given phase is generated, by the clock generation circuit, responsive to activation of the clock selection signals. A selection enable signal is activated to one or more flip-flops of a first flip-flop bank; wherein activating the selection signal configures the flip-flops to change state responsive to the clock signal. A state of the flip-flops changes responsive to the clock signal. Power consumption of the mixed signal circuit is balances across multiple clock responsive to changing the state of the flip-flops.

BRIEF DESCRIPTION OF THE DRAWINGS

For a detailed description of various examples, reference will now be made to the accompanying drawings in which.

DETAILED DESCRIPTION

Figure 1:
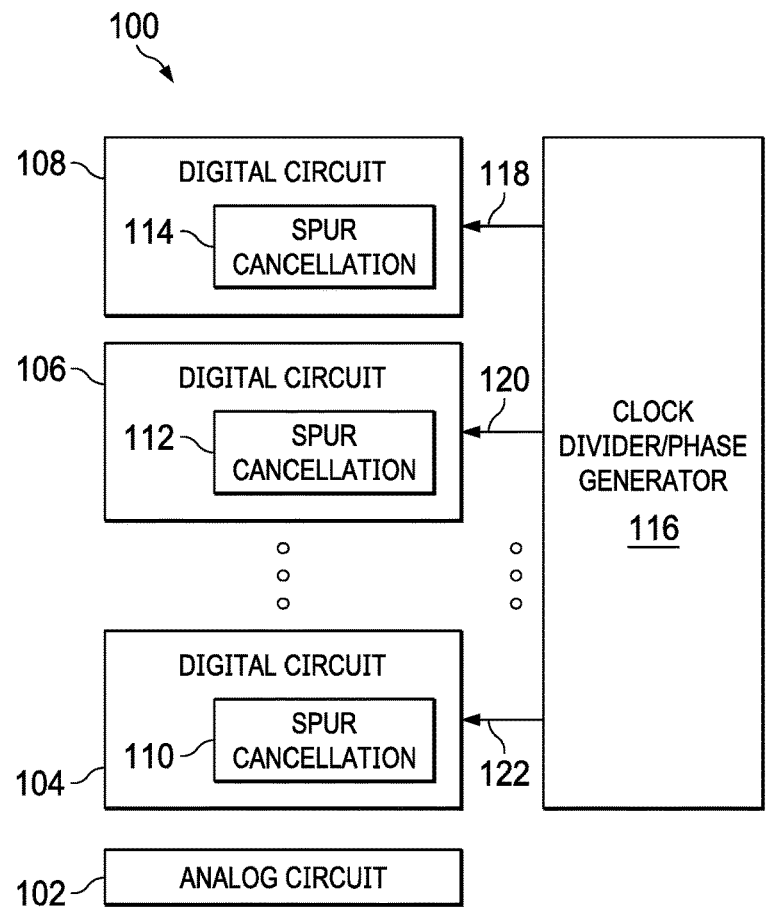
FIG. 1 shows a block diagram for an example mixed signal circuit that includes spur cancellation in accordance with the present disclosure.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

In a mixed signal circuit, such as a mixed signal system on chip (SoC), switching in the digital circuits creates ripples on the power network/substrate which can couple to analog circuits and create undesirable spurs in the spectrum. For example, in an analog-to-digital converter (ADC), if digital circuitry is clocked by a one-quarter sampling frequency clock then a spur may be induced in the ADC data at one-quarter of the sampling frequency. The magnitude and frequency of the spur depends on the divided clocks used in the digital circuitry and the degree of mismatch in power consumed at different phases of the divided clocks.

The spurs may also be mode dependent, i.e., dependent on whether the digital circuits are active or inactive. Circuit simulations are executed to characterize the imbalance in power consumption with respect to different phases of the divided clocks. However, it is difficult to characterize the spurs before the integrated circuit is fabricated, and even after balancing a design with load balanced clock phasing, some residual spurs based on activity or mode of operation may be present.

Implementations of the present disclosure include a spur cancellation circuit that reduces spurs after a mixed signal integrated circuit has been fabricated by balancing the power consumed across multiple clock phases. The spur cancellation circuit includes one or more clock generation circuits and one or more flip-flop banks, where each of the flip-flop banks is clocked by one of the clock generation circuits. Multiple instances of the spur cancellation circuit are disposed in a mixed signal integrated circuit. For example, an instance of the spur cancellation circuit is disposed within or proximate to each digital circuit block of the mixed signal integrated circuit. After the mixed signal integrated circuit has been fabricated, the power consumed at each phase of the clock in each digital function block is measured, and the associated spur cancellation block is programmed to balance the power consumed at the different clock phases by increasing power consumption at the clock phases having lower measured power consumption. For example, the clock generation circuit of a spur cancellation block is programmed to generate a clock corresponding to a phase having lower power consumption, and clock a number of flip-flops of the associated flip-flop bank selected to increase the power consumption at the phase to a level corresponding to a higher amount of power consumed at different phase of the clock. Thus, the power consumed across the different clock phases is balanced and the amplitude of spurs caused by the power imbalance is reduced.

FIG. 1 shows a block diagram for a mixed signal circuit 100 that includes spur cancellation in accordance with the present disclosure. The mixed signal circuit 100 includes an analog circuit 102, one or more digital circuits 104-108, and a clock divider/phase generator circuit 116. While the mixed signal circuit 100 is illustrated as including three digital circuits (or digital circuit blocks), implementations of the mixed signal circuit 100 include any number of digital circuits. The digital circuits 104-108 include sequential and combinatorial logic circuits that change state on edges of a clock signal. The clock divider/phase generator circuit 116 generates the clock signals that are applied in the digital circuits 104-108. In FIG. 1, the clock divider/phase generator circuit 116 provides clock signals 118 to the digital circuit 108, provides clock signals 120 to the digital circuit 106, and provides clock signals 122 to the digital circuit 104. At least some of the clock signals 118-122 are generated as different phases of a base clock signal.

The analog circuit 102 includes circuits that process analog signals, such as amplifiers and filters. The analog circuit 102 and the digital circuits 104-108 are fabricated on a same substrate, and noise generated by the digital circuits 104-108 propagates to the analog circuit 102 through the power system (e.g., ground or power supply rails) or the substrate. Imbalance in the power consumed in the digital circuits 104-108 at the edges of the clock signals 118-122 can induce a spur in the signals processed in the analog circuit 102.

The digital circuits 104, 106, and 108 respectively include spur cancellation circuits 110, 112, and 114. The spur cancellation circuits 110-114 balance the power consumed in each of the digital circuits 104-108 at each of the clock signals 118-122. That is, the spur cancellation circuit 110 balances the power consumed in the digital circuit 104 at the clock signals 122, the spur cancellation circuit 112 balances the power consumed in the digital circuit 106 at the clock signals 120, and the spur cancellation circuit 114 balances the power consumed in the digital circuit 108 at the clock signals 118. By balancing the power consumed at the different clock phases applied in the digital circuits 104-108, the spur cancellation circuits 110-114 eliminate or reduce the amplitude of spurs induced in the analog signals processed by the analog circuit 102.

Figure 2:
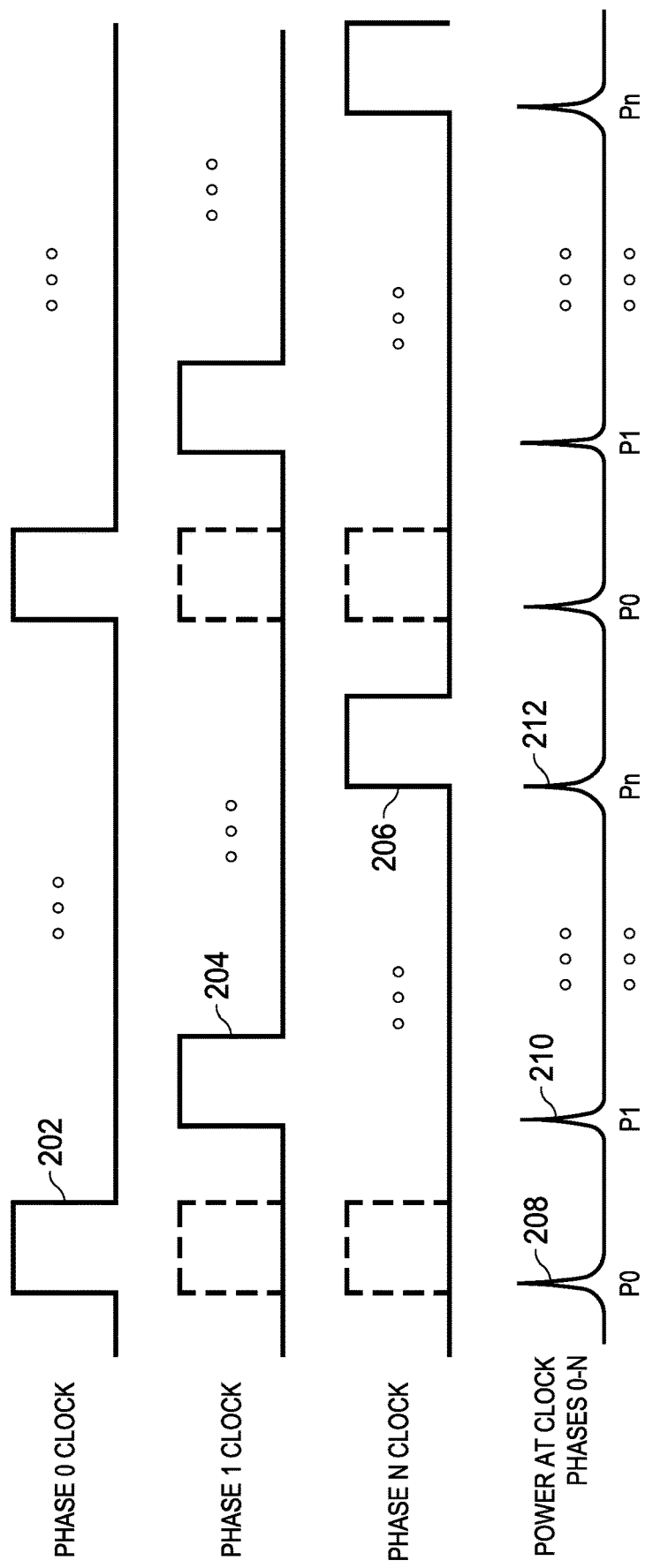
FIG. 2 shows signals representative of spur cancellation using the spur cancellation circuits of the mixed signal circuit in accordance with the present disclosure.

FIG. 2 shows signals representative of spur cancellation using the using spur cancellation circuits 110-114 of the mixed signal circuit 100 in accordance with the present disclosure. In FIG. 2, a first phase 202, a second phase 204, and an Nth phase 206 of a clock signal are shown. The power 208 consumed at the first phase 202, the power 201 consumed at the second phase 204, and the power 212 consumed at the Nth phase 206 are also shown. The magnitudes of the power 208, the power 210, and the power 212 have been adjusted by the spur cancellation circuits 110-114, such that the magnitudes of the power 208, the power 210, and the power 212 are approximately equal to prevent spurs in the analog circuit 102. If the magnitudes of the power 208, the power 210, and the power 212 were unequal (i.e., power consumed at the first phase 202, the second phase 204, and the Nth phase 206 were imbalanced) then a spur may be induced in the analog circuit 102.

Figure 3:
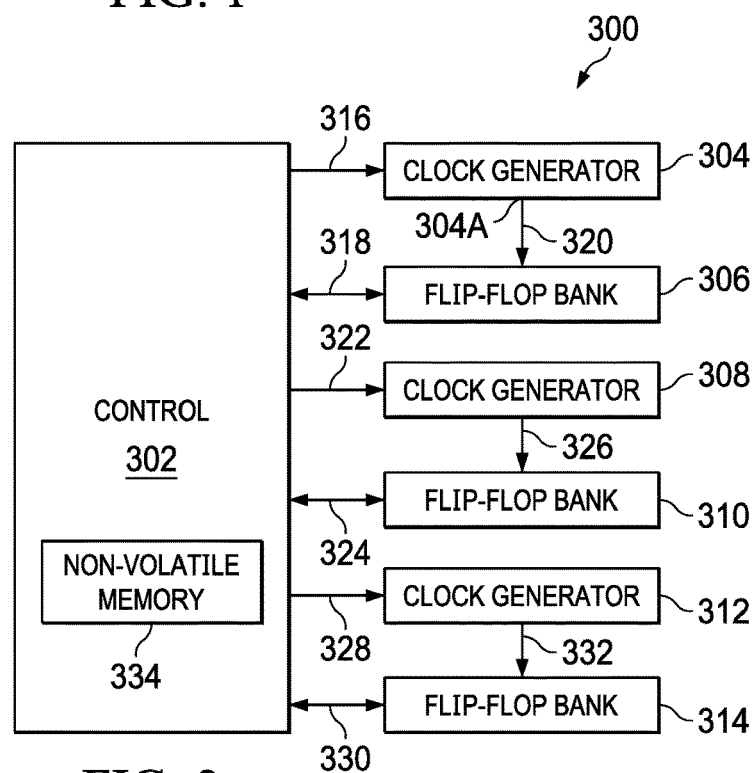
FIG. 3 shows a block diagram for an example spur cancellation circuit in accordance with the present disclosure

FIG. 3 shows a block diagram for an example spur cancellation circuit 300 in accordance with the present disclosure. The spur cancellation circuit 300 is an implementation of the spur cancellation circuit 110, the spur cancellation circuit 112, or the spur cancellation circuit 114. The spur cancellation circuit 300 includes a control circuit 302, and one or more clock generation circuits and flip-flop banks coupled to the control circuit 302. The implementation of the spur cancellation circuit 300 shown in FIG. 3 includes clock generation circuit 304 and associated flip-flop bank 306 coupled to the clock generation circuit 304, clock generation circuit 308 and associated flip-flop bank 310 coupled to the clock generation circuit 308, and clock generation circuit 312 and associated flip-flop bank 314 coupled to the clock generation circuit 312. Other implementations of the spur cancellation circuit 300 include a different number of clock generation circuits and associated flip-flop banks. In the 300, the purpose of the flip-flop bank is to provide controllable power consumption and the purpose of the clock generation circuitry is to provide controllable timing of the flip-flip bank power consumption.

Each of the clock generators 304, 308, and 312 is coupled to the control circuit 302 and receives from the control circuit 302 control signals that specify the clock signals to be generated. The control circuit 302 provides control signals 316 to the clock generation circuit 304 that cause the clock generation circuit 304 to generate a clock signal 320 that is provided to the flip-flop bank 306. The clock signal 320 includes one or more phases of a clock signal at which flip-flops of the flip-flop bank 306 are to be clocked to increase the power consumed at the clock phases. The control circuit 302 provides control signals 322 to the clock generation circuit 308 that cause the clock generation circuit 308 to generate a clock signal 326 that is provided to the flip-flop bank 310. The clock signal 326 includes one or more phases of a clock signal at which flip-flops of the flip-flop bank 310 are to be clocked to increase the power consumed at the clock phases. Similarly, the control circuit 302 provides control signals 328 to the clock generation circuit 312 that cause the clock generation circuit 312 to generate a clock signal 332 that is provided to the flip-flop bank 314. The clock signal 332 includes one or more phases of a clock signal at which flip-flops of the flip-flop bank 314 are to be clocked to increase the power consumed at the clock phases.

Each of the flip-flop banks 306, 310, and 314 is coupled to the control circuit 302, and includes a plurality of flip-flops. The control circuit 302 generates control signals that specify a data pattern to be clocked in the flip-flops and control the number of flip-flops that change state (in accordance with the data pattern) responsive to the clock received from the associated clock generation circuit. In FIG. 3, the control circuit 302 provides control signals 318, 324, and 330 to the flip-flop banks 306, 310, and 314 respectively.

The control circuit 302 includes non-volatile memory 334 that stores the parameters for setting the control signals provided to the clock generators and the flip-flop banks. The parameters stored in the non-volatile memory 334 are determined after the mixed signal circuit 100 has been fabricated and the power consumed at each clock phase in each digital circuit measured. The control circuit 302 also includes state machine circuitry to control the sequence and timing of activation of the control signals provided to the clock generators and the flip-flop banks.

Figure 4:
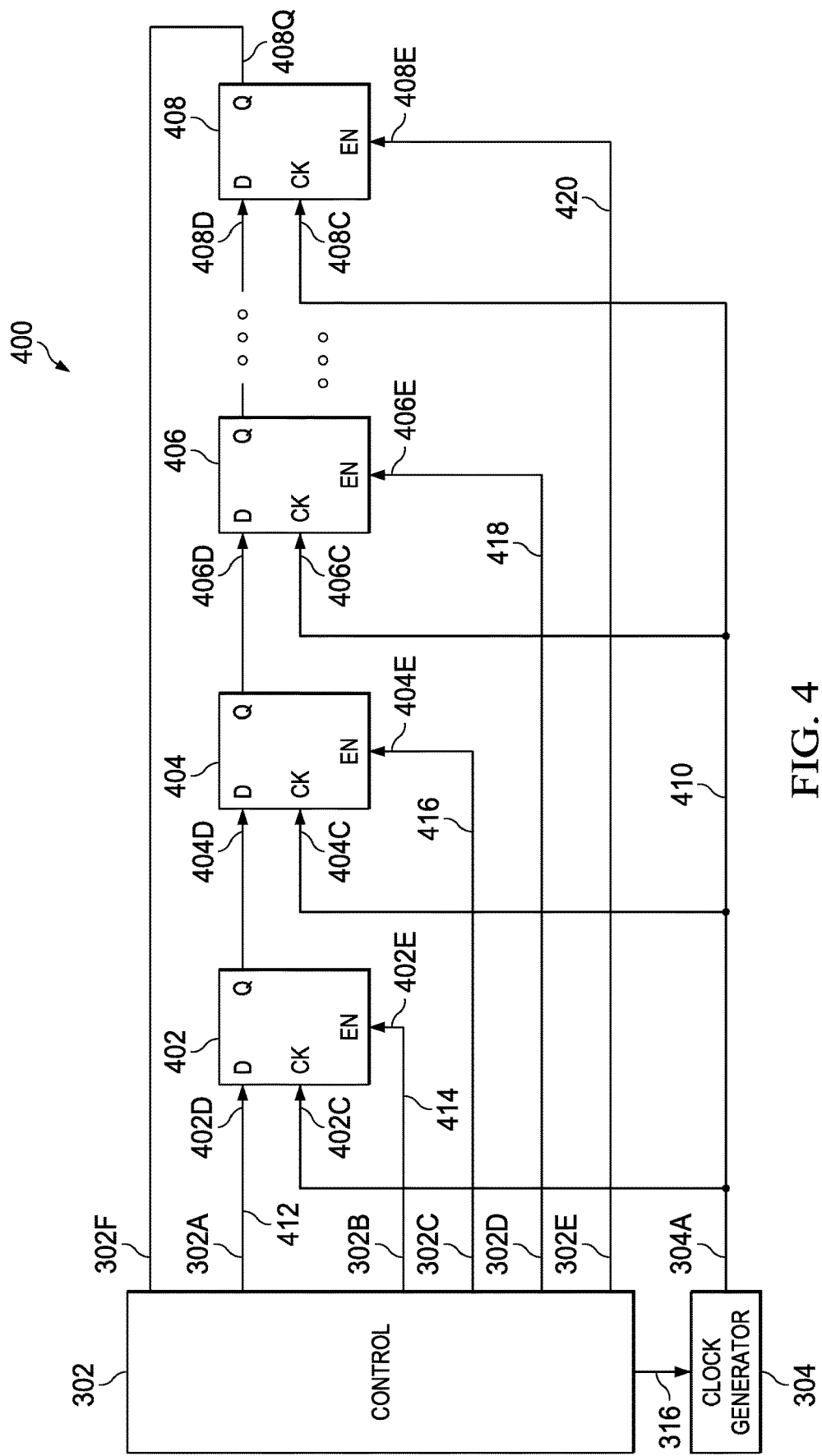
FIG. 4 shows a schematic diagram for an example flip-flop bank of a spur cancellation circuit in accordance with the present disclosure

FIG. 4 shows a schematic diagram for an example flip-flop bank 400 of a spur cancellation circuit 300 in accordance with the present disclosure. The flip-flop bank 400 is an implementation of the flip-flop bank 306, the flip-flop bank 310, or the flip-flop bank 314. The control circuit 302 and the clock generation circuit 304, which are not components of the flip-flop bank 400, are also shown in FIG. 4 for ease of reference.

The flip-flop bank 400 includes a plurality of flip-flops. Four flip-flops 402, 404, 404, and 406 are shown in FIG. 4, but implementations of the flip-flop bank 400 include any number of flip-flops. Each of the flip-flops 402, 404, 406, and 408 includes a clock input 402C, 404C, 406C, and 408C respectively, that is coupled to a clock output 304A of the clock generator 304. Each of the flip-flops 402, 404, 406, and 408 respectively includes a clock enable input 402E, 404E, 406E, and 408E, that is in-turn respectively coupled to a clock enable output 302B, 302C, 302D, or 302E of the control circuit 302. In some implementations of the flip-flop bank 400, each flip-flop clock enable input is coupled to clock gating circuitry that enables or disables clocking of the flip-flop responsive to an enable signal received from a corresponding clock enable output of the control circuit 302.

The control circuit 302 includes a clock enable output for each flip-flop 402-408 of the flip-flop bank 400, which allows the control circuit 302 to individually select one or more of the flip-flops 402-408 to change state responsive to the clock signal 410 received from the clock generation circuit 304. Each of the flip-flops 402, 404, 406, and 408 includes a data input 402D, 404D, 406D, and 408D respectively that is coupled to a data output 302A of the control circuit 302. In the flip-flop bank 400, the flip-flops 402, 404, 406, and 408 are coupled in series to form a shift register. The flip-flops are connected differently in some implementations of the flip-flop bank 400. The data input 402D is of the flip-flop 402 is coupled to the data output 302A of the control circuit 302 for receipt of the data value 412 (data pattern) to be clocked into the flip-flops 402, 404, 406, and 408.

In some implementations of the spur cancellation circuit 300, an output of a last of the serially coupled flip-flops is coupled to a data input 302F of the control circuit 302. In the flip-flop bank 400, the output 408Q of the flip-flop 408 is coupled to the data input 302F of the control circuit 302. The number of the flip-flops of the flip-flop bank 400 enabled by the control circuit 302 and the data pattern provided to the flip-flop bank 400 by the control circuit 302 are selected to increase the power consumed at the clock signal 410 by a predetermined amount.

Figure 5:
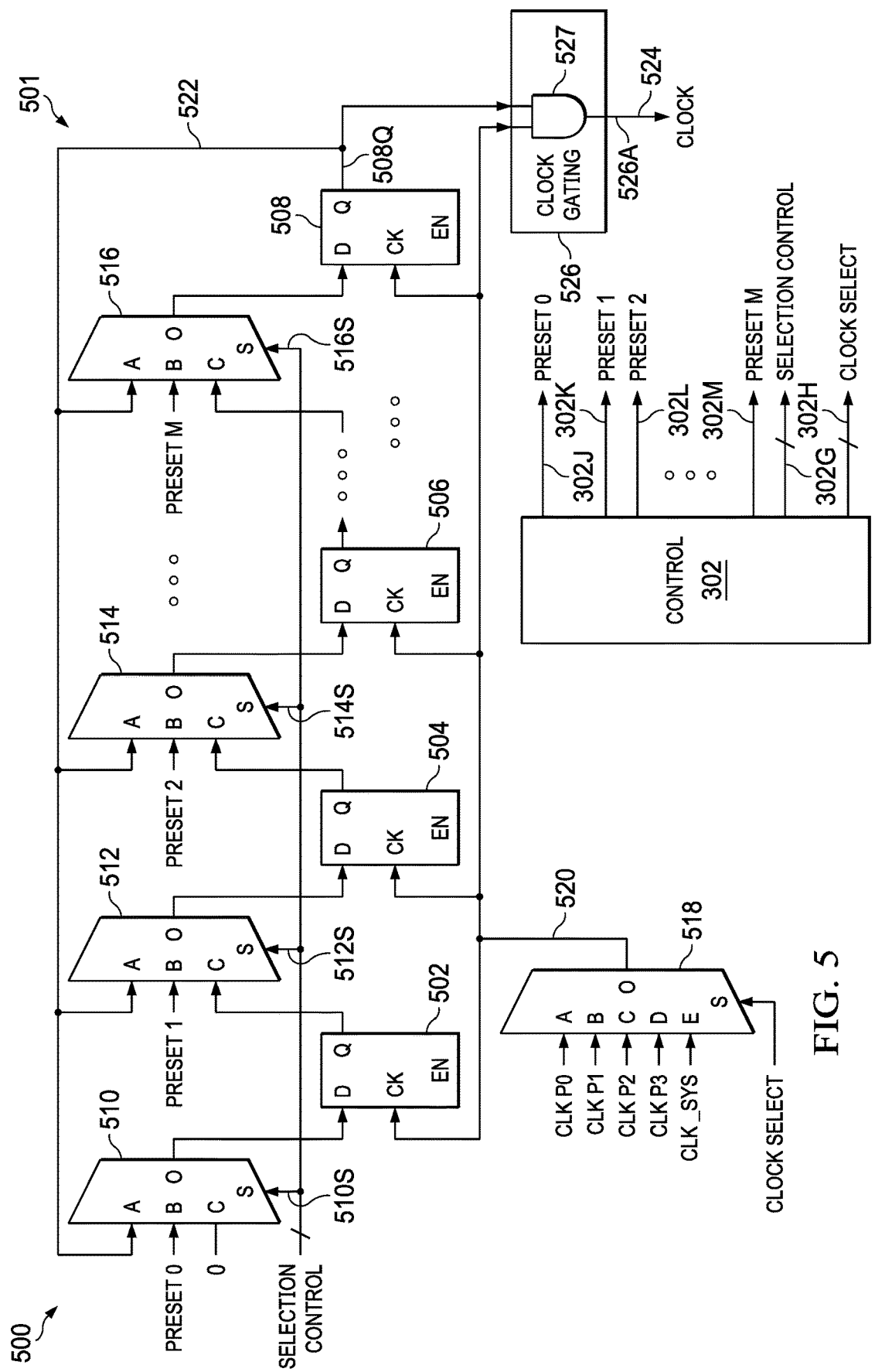
FIG. 5 shows a schematic diagram for an example clock generation circuit of a spur cancellation circuit in accordance with the present disclosure.

FIG. 5 shows a schematic diagram for an example clock generation circuit 500 of a spur cancellation circuit 300 in accordance with the present disclosure. The clock generation circuit 500 is an implementation of the clock generation circuit 304, the clock generation circuit 308, or the clock generation circuit 312. The control circuit 302, which is not a component of the clock generation circuit 500, is also shown in FIG. 5 for ease of reference. The clock generation circuit 500 includes a ring counter 501, clock gating circuitry 526, and an input clock selector 518.

The ring counter 501 includes a plurality of flip-flops and a plurality of selection circuits, where a selection circuit is coupled to the data input of each of the flip-flops. In FIG. 5, four flip-flops 502, 504, 506, and 508, and four selection circuits 510, 512, 514, and 516 are shown. Some implementations of the ring counter 501 include a different number of flip-flops and selection circuits. The selection circuits 510-516 selectably route to the data input of a connected flip-flop: a preset value, output of an immediately preceding flip-flop of the ring counter 501, or feedback from the output of the ring counter 501. For example, the selection circuit 512 selectable routes the output of the flip-flop 502, the output 522 of the ring counter 501, or a preset signal provided by the control circuit 302 to the data input of the flip-flop 504. The control circuit 302 includes a plurality of clock preset outputs 302J-302M that are coupled to the selection circuits 510-516 and provide a preset signal for each flip-flop 502-508, thereby providing control over the pattern circulated in the ring counter 501. In some implementations of the clock generation circuit 500, the output 522 of the ring counter 501 is a gating signal (i.e., a clock enable signal) that the clock gating circuitry 526 applies to gate the clock signal 520. For example, if the control circuit 302 presets a single "1" value into the ring counter 501, then the output 522 enables a single clock pulse per cycle through the clock gating circuitry 526 to form the output clock 524, where the single clock pulse corresponds to a desired clock phase. Similarly, if the control circuit 302 preset a "1" value into multiple flip-flops of the ring counter 501, then the output 522 enables multiple clock pulses per cycle through the ring counter 501 to form the output clock 524, where each clock pulse corresponds to a different clock phase. The output clock 524 is provided to the flip-flop bank 306.

Each of the selection circuits 510, 512, 514, and 516 respectively includes a control input 510S, 512S, 514S, and 516S that is coupled to selection control outputs 302G of the control circuit 302. The selection control signals provided by the control circuit 302 at the selection control outputs 302G select one of the preset signal, the preceding flip-flop output signal, and the ring counter output 522 to route to the output of the selection circuit and to the flip-flip coupled to the output of the selection circuit.

The input clock selector 518 is coupled to the ring counter 501 and the clock gating circuitry 526. Each of the flip-flops of the ring counter 501 is clocked by the clock signal 520 provided by the input clock selector 518. The input clock selector 518 selects one of a plurality of input clocks to provide as the clock signal 520. In FIG. 5, the input clock selector 518 selects from five clock input signals: a system clock signal (CLK_SYS) and four phase clock signals (CLK_P0, CLK_P1, CLK_P2, and CLK_P3) which are derived the system clock signal in some implementations. Clock selection is controlled by clock select signals provided at outputs 302H of the control circuit 302.

The clock gating circuitry 526 is coupled to the ring counter 501 (output 508Q), and includes combinatorial and/or sequential logic (e.g., gates and latches) to gate the clock signal 520 based on the output 522. For example, the clock gating circuitry 526 includes an "AND" gate 527 to gate the clock signal 520 based on the output 522. Some implementations of the clock gating circuitry 526 include circuitry that selectively provides the output 522 as the output clock 524. The output 526A of the clock gating circuitry 526 is coupled to a clock input of each flip-flop of a flip-flop bank that is coupled to the clock generation circuit 500 (e.g., the output 526A is an implementation of the output 304A).

Figure 6:
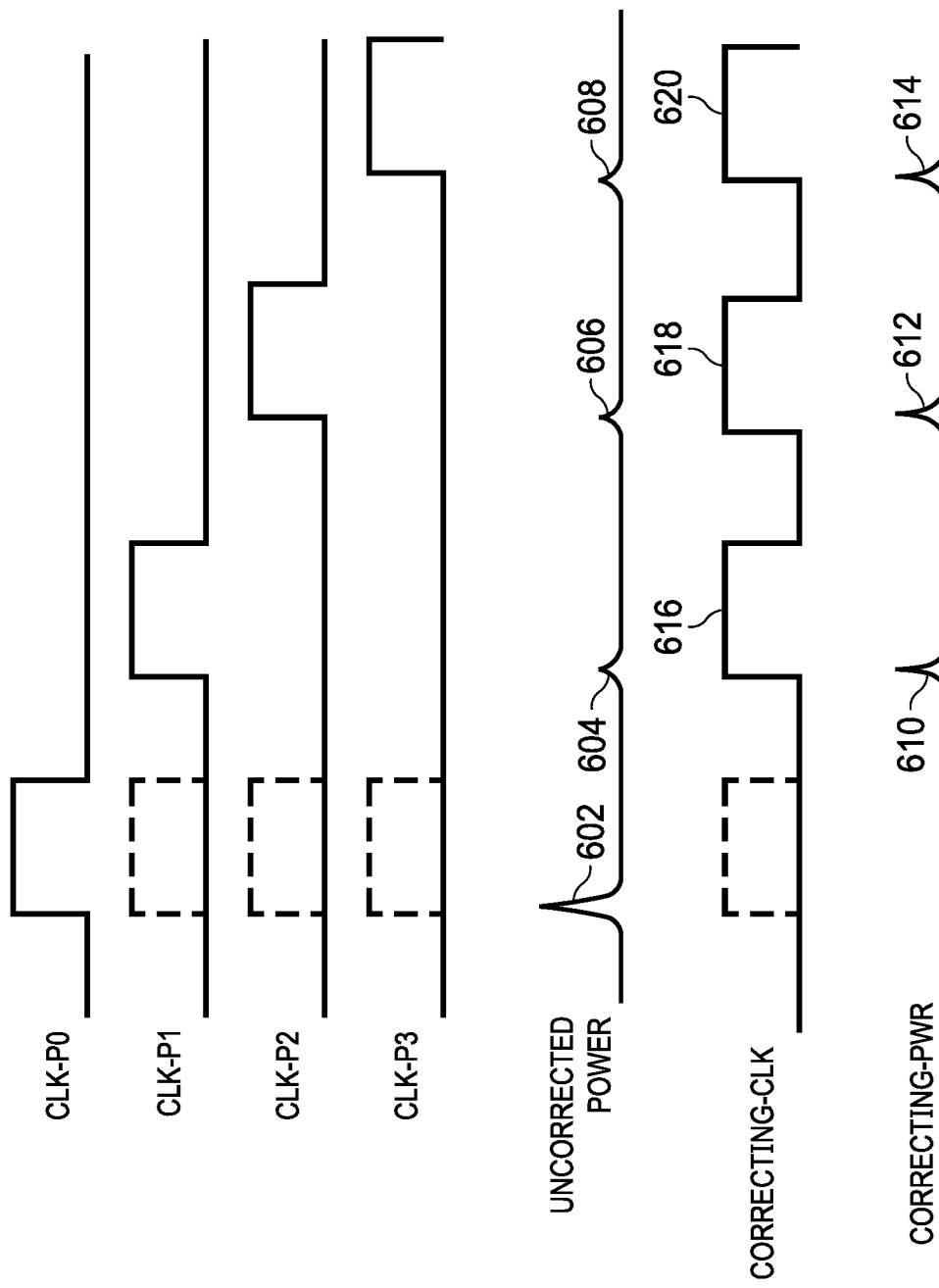
FIG. 6 shows signals representative of spur cancellation using a single correction clock signal in a spur cancellation circuit in accordance with the present disclosure.

FIG. 6 shows signals representative of spur cancellation using a single correction clock signal (i.e., a single output clock 524) in a spur cancellation circuit 300 in accordance with the present disclosure. FIG. 6 shows the clock phases (CLK_P0, CLK_P1, CLK_P2, and CLK_P3) applied in the digital circuit 108. The amounts of power consumed in the digital circuit 108 at each clock phase without application of the spur cancellation circuit 114 are shown as power 602, power 604, power 606, and power 608 respectively. The power 602 is substantially higher than the power 604, the power 606, and the power 608 which will produce a spur in the analog circuit 102.

The spur cancellation circuit 300 increases the power consumed at CLK_P1, CLK_P2, and CLK_P3 to balance the power consumed across the four clock phases. In FIG. 6, because the powers consumed at the CLK_P1, CLK_P2, and CLK_P3 are similar, the clock generation circuit 500 is preset to generate an output clock 524 that includes pulses 616, 618, and 620 respectively corresponding to CLK_P1, CLK_P2, and CLK_P3. The control circuit 302 enables a number of the flip-flops of the flip-flop bank clocked by the output clock 524. The flip-flops are selected to increase the power consumed at the CLK_P1, CLK_P2, and CLK_P3 such that the power consumption is balanced across the four clock phases. The enabled flip-flops clock the data pattern provided by the control circuit 302 and consume the power 610, 612, and 614 at the CLK_P1, CLK_P2, and CLK_P3. The sum of the powers 604 and 610, the powers 606 and 612, and the powers 608 and 620, substantially equalizes the power consumed at the four clock phases and reduces spurs in the analog circuit 102 caused by power imbalance across the clock phases.

Figure 7:
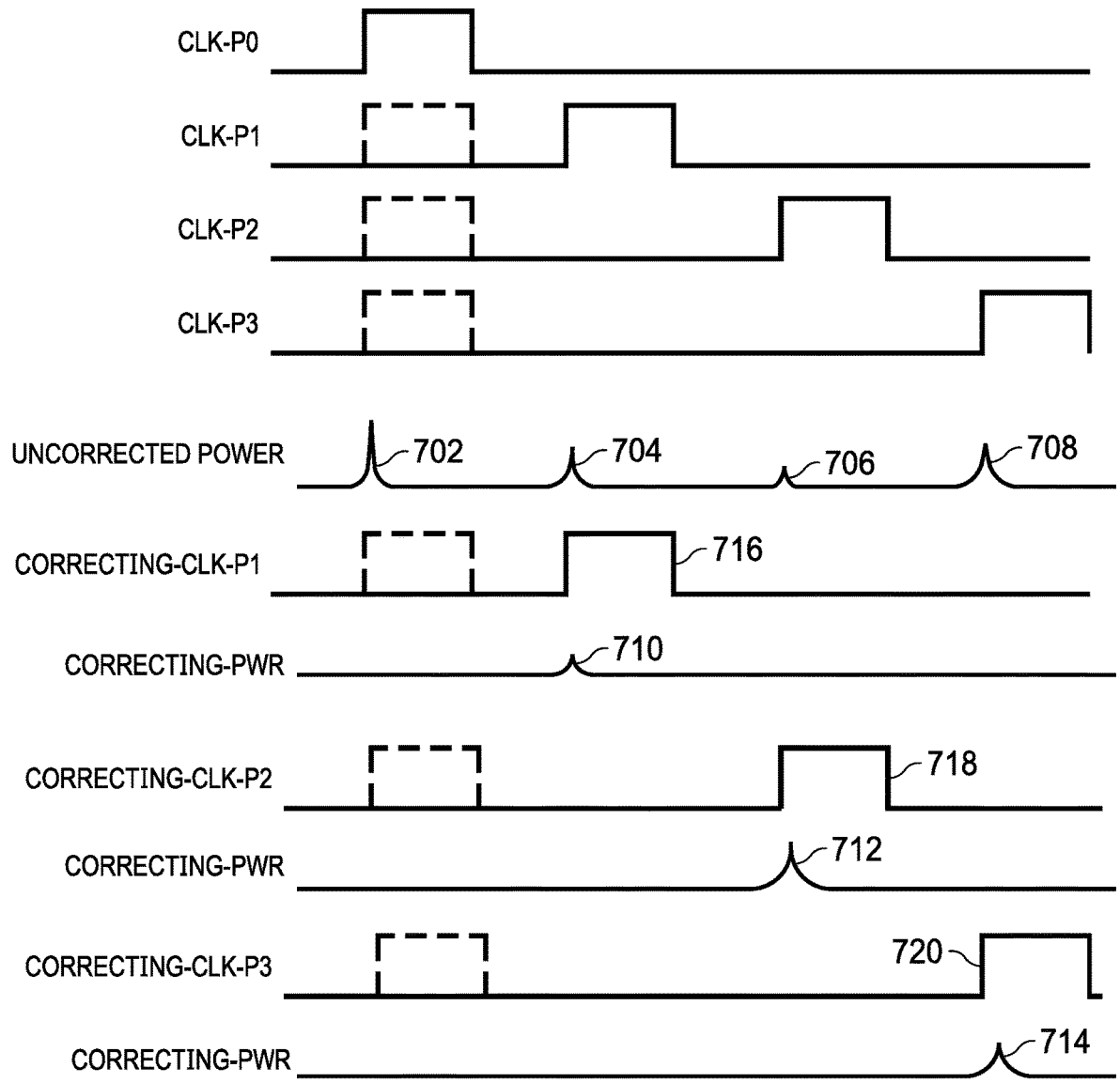
FIG. 7 shows signals representative of spur cancellation using multiple correction clock signals in a spur cancellation circuit in accordance with the present disclosure.

FIG. 7 shows signals representative of spur cancellation using multiple correction clock signals in a spur cancellation circuit 300 in accordance with the present disclosure. FIG. 7 shows the clock phases (CLK_P0, CLK_P1, CLK_P2, and CLK_P3) applied in the digital circuit 108. The amounts of power consumed in the digital circuit 108 at each clock phase without application of the spur cancellation circuit 114 are shown as power 702, power 704, power 706, and power 708 respectively. The power 702 is substantially higher than the power 704, the power 706, and the power 708 which will produce a spur in the analog circuit 102. The power 704, the power 706, and the power 708 are substantially different from one another.

The spur cancellation circuit 300 increases the power consumed at CLK_P1, CLK_P2, and CLK_P3 to balance the power consumed across the four clock phases. In FIG. 7, because the powers consumed at the CLK_P1, CLK_P2, and CLK_P3 are different, the control circuit 302 presets a first instance of the clock generation circuit 500 to generate an output clock 524 that includes pulse 716, presets a second instance of the clock generation circuit 500 to generate an output clock 524 that includes pulse 718, and presets a third instance of the clock generation circuit 500 to generate an output clock 524 that includes pulse 720, where the pulses 716, 718, and 720 respectively corresponding to CLK_P1, CLK_P2, and CLK_P3. The control circuit 302 enables a number of the flip-flops of the different flip-flop banks clocked by the pulse 716, the pulse 718, or the pulse 720. A different number of flip-flops are selected in each of the different flip-flop banks to increase the power consumption at the associated clock phase as needed. The flip-flops are selected to increase the power consumed at the CLK_P1, CLK_P2, and CLK_P3 such the power consumption is balanced across the four clock phases. The enabled flip-flops clock the data pattern provided by the control circuit 302 and consume the power 710, 712, and 714 at the CLK_P1, CLK_P2, and CLK_P3. The sum of the powers 704 and 710, the powers 706 and 712, and the powers 708 and 720, substantially equalizes the power consumed at the four clock phases and reduces spurs in the analog circuit 102 caused by power imbalance across the clock phases.

Figure 8:
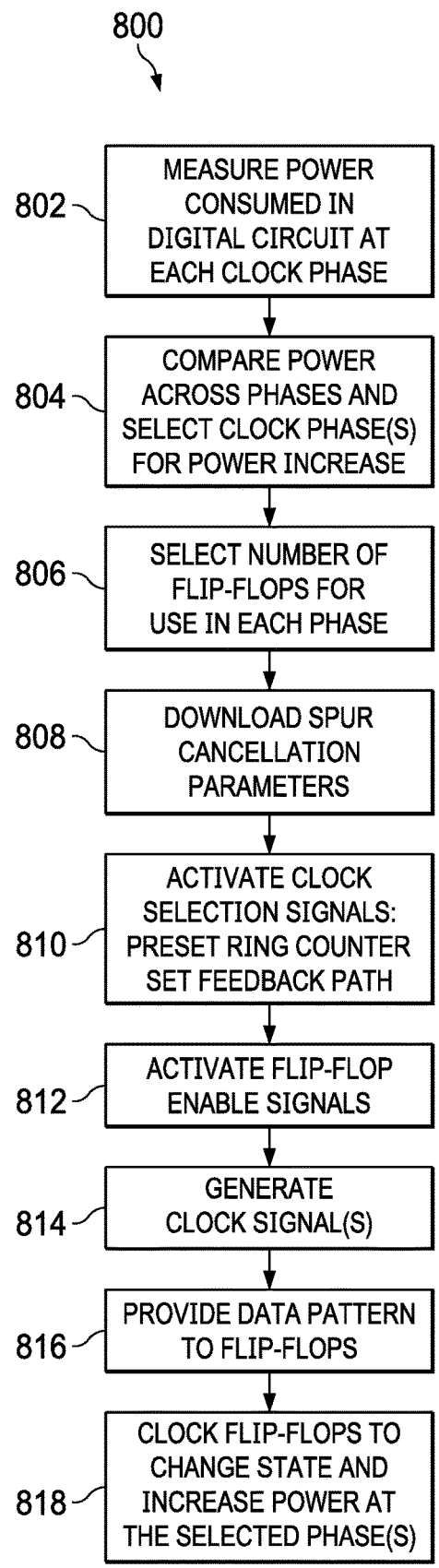
FIG. 8 shows a flow diagram for an example method for spur cancellation in a mixed signal circuit in accordance with the present disclosure.

FIG. 8 shows a flow diagram for an example method 800 for spur cancellation in a mixed signal circuit in accordance with the present disclosure. Though depicted sequentially as a matter of convenience, at least some of the actions shown can be performed in a different order and/or performed in parallel. Additionally, some implementations perform only some of the actions shown.

In block 802, the mixed signal circuit 100 has been fabricated as an integrated circuit and the power consumed by each digital circuit (i.e., each digital circuit block) at each clock phase applied in the digital circuit is measured.

In block 804, the power consumed at each clock phase by a given digital circuit is compared. The clock phases at which a lower amount of power is consumed are selected for power increase via the spur cancellation circuit 300 of the digital circuit. For example, if four clock phases are applied in the digital circuit 108, then the one (i.e., a first) of the four clock phases at which the most power is consumed is identified, and the power consumed at the remaining three clock phases will be increased by operation of a spur cancellation circuit 300 to be substantially the same as the power consumed at the first clock phase.

In block 806, the number of flip-flops of the flip-flop bank 400 to be applied in each clock phase subject to a power increase is selected, and a data pattern to be applied in the flip-flops is selected. For example, if a flip-flop changing state a given rate consumes a given power, then the number of flip-flops selected is a function of the needed power increase, the power consumed per flip-flop, and the rate of state change provide by the data pattern clocked into the flip-flops.

In block 808, the parameters for increasing the power in the digital circuit are downloaded to the control circuit 302 and stored in non-volatile memory. For example, an enable flag for each flip-flop of the flip-flop bank 400, a data pattern to provide to the flip-flops, a ring counter preset value, and a clock select value to control the input clock selector 518 are downloaded to the control circuit 302 and stored in non-volatile memory.

In block 810, the clock generation circuit 500 is being initialized for operation. The control circuit 302 activates clock selection signals provided to the clock generation circuit 500. For example, a preset value is loaded into the ring counter 501, and the feedback path of the output 522 of the ring counter 501 is selected. The clock selection signals configure the clock generation circuit 500 to generate an output clock 524 having a selected phase.

In block 812, the flip-flop bank 400 is being initialized for operation. The control circuit 302 activates an enable signal for each flip-flop of the flip-flop bank 400 to select the flip-flops that will be used for spur cancellation. That is, the enable signals configure the flip-flops to change state responsive to the output clock 524.

In block 814, the clock generation circuit 500 generates an output clock 524 based on the output 522 of the ring counter 501 and the clock signal 520 provided by the input clock selector 518. The output clock 524 has the selected phase of block 810.

In block 816, the control circuit 302 provides a data pattern to the flip-flops selected in block 812.

In block 818, the data pattern is clocked into the flip-flops by the output clock 524 generated in block 814 and the power consumed by the digital circuit 108 increases as the flip-flops change state at the clock phase corresponding to the output clock 524 generated in block 814. The power consumed by the flip-flop state changes balances the power consumption of the mixed signal circuit 100 across multiple clock phases.

In some implementations of the mixed signal circuit 100, the mixed signal circuit 100 can operate in any of multiple modes. In such implementations, the power consumed at the different clock phases is dependent on the operating mode of the mixed signal circuit 100. The operations of blocks 800-808 of the method 800 are performed with respect to each operating mode of the mixed signal circuit 100, and the parameters applied in blocks 810 and 812 selected based on the current operating mode of the mixed signal circuit 100. Thus, the operation of the spur cancellation circuit 300 is a function of the current operating mode of the mixed signal circuit 100.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A mixed signal circuit, comprising:
an analog circuit; and
a digital circuit, comprising:
a spur cancellation circuit, comprising:
a clock generation circuit; and
a flip-flop bank coupled to the clock generation circuit, and comprising:
a plurality of flip-flops, each of the flip-flops comprising a clock input coupled to a clock output of the clock generation circuit;
a control circuit coupled to the clock generation circuit and the flip-flop bank and comprising:
a plurality of clock enable outputs, each of the clock enable outputs coupled to a clock enable input of one of the flip-flops; and
a data output coupled to a data input of one of the flip-flops;
wherein the clock generation circuit comprises:
a ring counter comprising:
a plurality of flip-flops; and
a plurality of selection circuits, each of the selection circuits coupled to an output of a first of the flip-flops of the ring counter and an input of a second of the flip-flops of the ring counter;
clock gating circuitry coupled to the ring counter, and comprising a logic gate coupled to:
an output of the ring counter; and
an input clock selector.

2. The mixed signal circuit of claim 1, wherein the ring counter is coupled to the control circuit, and the control circuit comprises a plurality of clock preset outputs, each of the clock preset outputs coupled to one of the selection circuits.

3. The mixed signal circuit of claim 1, wherein an output of the clock gating circuit is coupled to the clock input of each of the flip-flops of the flip-flop bank.

4. The mixed signal circuit of claim 1, wherein the control circuit comprises a selection control output coupled to a selection control input of each of the selection circuits.

5. A mixed signal circuit, comprising:
an analog circuit; and
a digital circuit, comprising:
a spur cancellation circuit, comprising:
a clock generation circuit; and
a flip-flop bank coupled to the clock generation circuit, and comprising:
a plurality of flip-flops, each of the flip-flops comprising a clock input coupled to a clock output of the clock generation circuit;
a control circuit coupled to the clock generation circuit and the flip-flop bank and comprising:
a plurality of clock enable outputs, each of the clock enable outputs coupled to a clock enable input of one of the flip-flops; and
a data output coupled to a data input of one of the flip-flops;
wherein the control circuit comprises a data input coupled to a data output of one of the flip-flops of the flip-flop bank.

6. A spur cancellation circuit, comprising:
a clock generation circuit configured to generate a clock signal;
a flip-flop bank coupled to the clock generation circuit, and comprising a plurality of flip-flops configured to be clocked by the clock signal;
a control circuit coupled to the clock generation circuit and the flip-flop bank and configured to:
individually enable one or more of the flip-flops to change state responsive to the clock signal and consume a predetermined amount of power; and
provide a data value to be clocked into the flip-flops;
wherein the clock generation circuit comprises:
a ring counter configured to generate a clock enable signal; and
clock gating circuitry coupled the ring counter, and configured to generate the clock signal based on the clock enable signal and an input clock signal.

7. The spur cancellation circuit of claim 6, wherein the ring counter comprises:
a plurality of flip-flops; and
a plurality of selection circuits, each coupled to a data input of a first of the flip-flops, each of the selection circuits configured to selectively route to a data input of the first of the flip-flops an output signal produced by a second of the flip-flops.

8. The spur cancellation circuit of claim 7, wherein each of the selection circuits is configured to selectively route to the data input of the first of the flip-flops a preset signal provided by the control circuit.

9. The spur cancellation circuit of claim 7, wherein each of the selection circuits is configured to selectively route to the data input of the first of the flip-flops the clock enable signal generated by the ring counter.

10. The spur cancellation circuit of claim 7, wherein an output of the clock gating circuitry is coupled to a clock input of each of the flip-flops of the flip-flop bank.

11. A spur cancellation circuit, comprising:
a clock generation circuit configured to generate a clock signal;
a flip-flop bank coupled to the clock generation circuit, and comprising a plurality of flip-flops configured to be clocked by the clock signal;
a control circuit coupled to the clock generation circuit and the flip-flop bank and configured to:
individually enable one or more of the flip-flops to change state responsive to the clock signal and consume a predetermined amount of power; and
provide a data value to be clocked into the flip-flops;
wherein:
the clock generation circuit is a first clock generation and the flip-flop bank is a first flip-flop bank; and
the spur cancellation circuit comprises:
a second clock generation circuit configured to generate a second clock signal; and
a second flip-flop bank coupled to the second clock generation circuit, and comprising:
a plurality of flip-flops, each of the flip-flops of the second flip-flop bank configured to be clocked by the second clock signal;
wherein the control circuit is configured to:
individually enable one or more of the flip-flops of the second flip-flop bank to change state responsive to the second clock signal; and
provide a data value to be clocked into the flip-flops of the second flip-flop bank.

12. A method for cancelling spurs in a mixed signal circuit, comprising:
activating clock selection signals to a clock generation circuit; wherein the clock selection signals configure the clock generation circuit to generate a clock signal having a given phase;
generating, by the clock generation circuit, the clock signal having the given phase responsive to activation of the clock selection signals;
activating a selection enable signal to one or more flip-flops of a first flip-flop bank; wherein activating the selection signal configures the flip-flops to change state responsive to the clock signal;
changing a state of the flip-flops responsive to the clock signal; and
balancing power consumption of the mixed signal circuit across multiple clock phases responsive to changing the state of the flip-flops.

13. The method of claim 12, further comprising providing, at an input of the flip-flops, a data pattern to be clocked into the flip-flops by the clock signal.

14. The method of claim 12, further comprising:
comparing the power consumed at a plurality of phases by the mixed signal circuit; and
selecting the given phase as the phase of the plurality of phases having lowest power consumption.

15. The method of claim 12, wherein activating the clock selection signals comprises:
selecting feedback routing in a ring counter of the clock generation circuit; and
setting a counter preset value in the ring counter of the clock generation circuit.

16. The method of 12, further comprising selecting a number of flip-flops to change state responsive to the clock signal; the number of flop-flops selected to increase the power consumption of the mixed signal circuit at the given phase to a predetermined value.

* * * * *